United States Patent [19]

Pankove et al.

[11] 4,069,492
[45] Jan. 17, 1978

[54] ELECTROLUMINESCENT SEMICONDUCTOR DEVICE HAVING A BODY OF AMORPHOUS SILICON

[75] Inventors: Jacques Isaac Pankove, Princeton, N.J.; David Emil Carlson, Yardley, Pa.

[73] Assignee: RCA Corporation, New York, N.Y.

[21] Appl. No.: 716,532

[22] Filed: Aug. 23, 1976

[51] Int. Cl.² .................. H01L 33/00; H01L 45/00
[52] U.S. Cl. ................................... 357/17; 357/2; 357/61
[58] Field of Search .............. 357/2, 17, 61, 58

[56] References Cited
PUBLICATIONS

Fuhs, et al., *Int. Conf. On. Tetrahedrally Bonded Amorphous Semiconductors*, Yorktown Heights, N.Y., Mar. 20–22, 1974; pp. 345–350.
Spear, *Solid State Comm.*, vol. 17, pp. 1193–1196, Pergomon Press, 1975.
Spear et al., *5th Int. Conf. on Amorphorous and Liquid Semiconductors*, vol. I, Garmisch-Portenkirchen, Fed. Rep. Germany, Sept. 3–8, 1973.

*Primary Examiner*—Martin H. Edlow
*Attorney, Agent, or Firm*—H. Christoffersen; D. N. Calder; B. E. Morris

[57] ABSTRACT

A PIN or Schottky barrier semiconductor device having a body of amorphous silicon fabricated by a glow discharge is operated under forward bias conditions resulting in the emission of radiation from the device.

14 Claims, 3 Drawing Figures and second doped layers 13 and 15 are each about 100 to 1000A in thickness.

ELECTROLUMINESCENT SEMICONDUCTOR DEVICE HAVING A BODY OF AMORPHOUS SILICON

BACKGROUND OF THE INVENTION

The present invention relates to the utilization of semiconductor devices as radiation emitters, and more particularly to the operation of electroluminescent semiconductor devices having bodies of amorphous silicon fabricated by a glow discharge.

Semiconductor devices having bodies of amorphous silicon fabricated by a glow discharge in silane or in a gas atmosphere including hydrogen, silicon and a halogen selected from the group consisting of chlorine, bromine, and iodine, have been utilized as solar cells, photodetectors and current rectifiers. Specifically, some of these semiconductor devices have been PIN or Schottky barrier structures. One of the advantages of these devices is that they are low cost because they require relatively thin bodies of amorphous silicon, i.e. one micron or less. In the field of electroluminescent devices it would also be desirable to have thin semiconductor bodies, thereby reducing the materials cost in the fabrication of the electroluminescent devices. In addition, if the semiconductor material of an electroluminescent device is compatible with single crystalline or polycrystalline silicon there is an additional advantage of incorporating such an electroluminescent device in an integrated circuit chip.

SUMMARY OF THE INVENTION

An electroluminescent semiconductor device includes a body of amorphous silicon fabricated by a glow discharge. The device also includes means for forward biasing the body with a voltage so as to generate radiation in the body.

DETAILED DESCRIPTION OF THE INVENTION

Figure 1:
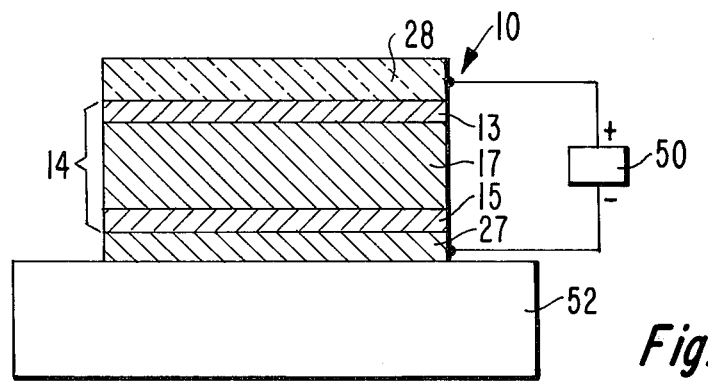
FIG. 1 is a cross-sectional view of a PIN semiconductor device utilized in the present invention.

Referring to FIG. 1, a first embodiment of an electroluminescent semiconductor device of the present invention is designated as 10. The electroluminescent semiconductor device 10 is a PIN structure. The electroluminescent device 10 includes a body 14 of amorphous silicon fabricated by a glow discharge. Although it is preferable to make the body 14 of amorphous silicon fabricated by a glow discharge in silane, $SiH_4$, the body 14 can also be fabricated by a glow discharge in a gas atmosphere which includes silicon, Si, hydrogen, $H_2$, and a halogen selected from the group consisting of chlorine, bromine and iodine.

An amorphous material is one which has no long range order or periodicity within the material. Amorphous silicon fabricated by a glow discharge possesses a short range order of no more than 20A. The lack of long range order of an amorphous silicon material fabricated by a glow discharge can be detected by X-ray or electron diffraction. The amorphous silicon of the body 14 formed by a glow discharge in silane can be distinguished from other amorphous silicon in that it has an average density of localized states in the energy gap on the order of $10^{17}/cm^3$ or less, in contrast to sputtered or evaporated amorphous silicon which has an average density of localized states of $10^{19}/cm^3$ or greater. Assuming a uniform spatial distribution the average density of localized states is determined by plotting the inverse of the capacitance squared $(1/C^2)$ as a function of voltage for the amorphous silicon device. The average density of localized states is deduced by those skilled in the art from the slope of the resulting line. Amorphous silicon fabricated by a glow discharge in silane has a drift mobility for electrons of $10^{-3}$ cm/V-sec. or greater. The drift mobility for electrons is measured by well known time of flight techniques such as impinging light pulses or electron beam pulses on the device and following the subsequent flow of electrons by a time sampling system. Furthermore, it has been estimated from photoconductivity measurements that the electron carrier lifetime of amorphous silicon fabricated by a glow discharge in silane is on the order of $10^{-5}$ seconds, while electron carrier lifetime in amorphous silicon formed by sputtering or evaporation is on the order of $10^{-11}$ seconds.

The body 14 includes a first doped layer 13, a second doped layer 15 spaced from and opposite the first doped layer 13, and an "intrinsic" layer 17 in contact with and between the first and second doped layers 13 and 15. The "intrinsic" layer 17 is undoped, but it has been discovered that undoped amorphous silicon fabricated by a glow discharge is usually slightly N type, i.e. when deposited on a deposition surface which is at a temperature of 100° C. or greater. The first and second doped layer 13 and 15 are of opposite conductivity type. For the purpose of discussion, the first doped layer 13 is of P type conductivity while the second doped layer 15 is of N type conductivity. Both the first and second doped layers 13 and 15 are of a high doping concentration, i.e. greater than $10^{18}/cm^3$ of dopants. Typically, the P type first doped layer 13 is doped with boron and the N type second doped layer 15 is doped with phosphorous.

A first electrode 28 is on a surface of the first doped layer 13 opposite the second doped layer 15. A function of the first electrode 28 is to provide an electrical contact to the body 14. Preferably, the first electrode 28 is either semi-transparent or transparent to the radiation generated in the body 14. The first electrode 28 may be a single layer of a material such as indium tin oxide or tin oxide which are both transparent to the radiation generated within the body 14 and have good electrical conductivity. Also the first electrode 28 can be a thin film metal, i.e. about 100A in thickness, such as chromium, antimony, palladium or platinum, which will be semi-transparent to the generated radiation. Furthermore, the first electrode 28 may be multi-layered such as a layer of indium tin oxide on a layer of a glass material. In such an instance, the indium tin oxide is in intimate contact with the first doped layer 13. The first electrode 28 can also function as a substrate, as is evident from the subsequent description of the fabrication of the device 10.

A second electrode 27 is on a surface of the second doped layer 15 opposite the first electrode 28. The second electrode 27 is of a material having good electrical conductivity, such as aluminum, chromium, tantalum, antimony, or niobium.

Typically, the "intrinsic" layer 17 of amorphous silicon is about 1 micron or less in thickness, while the first and second doped layers 13 and 15 are each a few hundred angstroms in thickness.

In the operation of the electroluminescent semiconductor device 10, a forward bias voltage is applied to the device 10 by connecting the first electrode 28 to the positive terminal of a voltage source 50 of the type well known by those in the art, and by connecting the second electrode 27 to the negative terminal of the voltage source 50, assuming that the first doped layer 13 is of P type conductivity and the second doped layer 15 in of N type conductivity. The voltage source 50 can be D. C. or A. C. Furthermore, the device 10 is typically at a temperature in the range of 78° K to 105° K. by contacting the device 10 to a temperature cooling means 52. When the voltage source is energized, hole carriers in the first doped layer 13 are injected into the "intrinsic" layer 17 and electron carriers in the second doped layer 15 are injected into the "intrinsic" layer 17. These injected carriers will recombine in the "intrinsic" layer 17 and it is the recombination of these carriers which generates radiation within the "intrinsic" layer 17. Since the first electrode 28 is semi-transparent or transparent to this generated radiation, the generated radiation will be observed through the first electrode 28.

As stated, the device 10 will electroluminesce when forward biased at a temperature in the range of 78° K. to 105° K. However, the device 10 will emit some radiation even at temperatures as high as room temperature, i.e. about 300° K. The emitted radiation of device 10 at a temperature of 300° K. is about 300 times weaker in intensity than the radiation emitted at 78° K. Thus, it is preferable to operate the device 10 at a temperature in the range of 78° K. to 105° K. Typically, the device 10 is cooled to a temperature in the range of 78° K. to 105° K. by mounting the device 10 to a temperature cooling means 52 such as the cold finger of a liquid nitrogen Dewar, or thermoelectric cooling apparatus well known to those in the art.

The radiation spectrum of the PIN device 10 peaks at $1.28 \pm 0.08$ eV when operated at 78° K. Thus, the emitted radiation is in the near infrared. The radiation spectrum has a width at half maximum of 0.2 eV, with the high energy edge of the spectrum cutting off at about 1.6 eV. With increasing ambient temperature, ie. from 78° K. to 300° K., the spectrum peak shifts to lower energies at a rate $dE/dT = -2.55 \times 10^{-4}$ eV/° K. Because of the high resistivity of the "intrinsic" layer 17 at 78° K a forward bias voltage of about 33V has to be applied to the device 10 as described, before a sufficient current can flow through the body 14. The intensity of the generated radiation increases with current, at first linearly with an external power efficiency of $6 \times 10^{-5}$ and sublinearly at higher currents.

Figure 2:
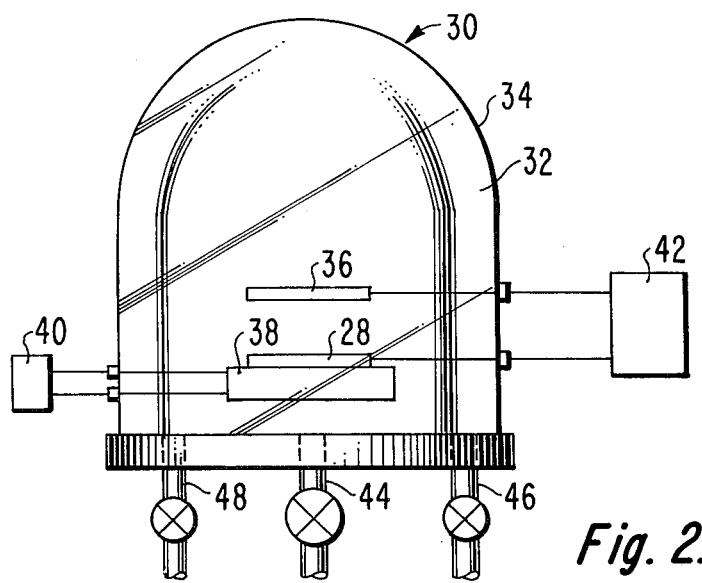
FIG. 2 is a schematic view of an apparatus for the fabrication of amorphous silicon by a glow discharge.

Referring to FIG. 2, a glow discharge apparatus suitable for carrying out the fabrication of the electroluminescent semiconductor device 10 of the present invention is generally designated as 30. The glow discharge apparatus 30 includes a vacuum chamber 32 defined by a vacuum bell jar 34 typically of a glass material. In the vacuum chamber 32 is an electrode 36 and a heating plate 38 spaced from and opposite the electrode 36. The electrode 36 is of a metallic material having good electrical conductivity such as platinum or stainless steel and is in the form of a screen or coil. The heating plate 38 is a ceramic frame which encloses heating coils which are energized from a current source 40 external from the vacuum chamber 32. A first outlet 44 into the vacuum chamber 32 is connected to a diffusion pump, a second outlet 46 is connected to a mechanical pump, and a third outlet 48 is connected to a gas bled in system which is the source of the various gases utilized in the glow discharge process. While the first outlet 44 is described as being connected to a diffusion pump, it is anticipated that a diffusion pump may not be necessary since the mechanical pump connected to the second outlet 46 may evacuate the system to a sufficiently low pressure.

In the fabrication of the electroluminescent semiconductor device 10, the first electrode 28 is assumed to be a layer of indium tin oxide on a layer of glass material. The electrode 28 is placed on the heating plate 38 of the apparatus 30 shown in FIG. 2 with the glass layer of the electrode 28 in intimate contact with the heating plate 38. The first electrode 28 is connected to one terminal of a power source 42 and the electrode 36 is connected to an opposite terminal of the power source 42. A voltage potential therefor exists between the electrode 36 and first electrode 28. The power source 42 can be either D. C. or it can be A. C., i.e. in the low frequency range for example 60 Hertz, or it can be R. F., i.e. in the high frequency range, for example on the order of megahertz. Typically, when the power source 42 is D. C. the electrode 36 is connected to the positive terminal of the power source 42, and the first electrode 28 is connected to the negative terminal of the power source 42. Thus, the electrode 36 functions as an anode and the first electrode 28 functions as a cathode when the power source 42 is energized. This is referred to as the cathodic D. C. mode of operation. However, in a D. C. operation the first electrode 28 and electrode 36 can be of the opposite polarities described, i.e. the first electrode 28 is the anode and the electrode 36 is the cathode, which is referred to as the anodic D. C. mode of operation. It has been discovered that the deposition rates are somewhat higher in the cathodic mode than in the anodic mode. Furthermore, R. F. glow discharge operation can be accomplished in electroless glow discharge apparatus of a type well known to those in the art, e.g. capacitive R. F. glow discharge system and inductive R. F. glow discharge system. However, more uniform deposition over a large area, i.e. greater than 10 cm$^2$, is attained in D. C. or A. C. glow discharge, as described than in electroless R.F. glow discharge.

The apparatus 30 is next prepared for deposition of the first doped layer 13, of P type conductivity, onto the indium tin oxide layer of electrode 28. The vacuum chamber 32 is evacuated to a pressure of about $10^{-6}$ torrs. Then silane with about $\frac{1}{2}$% to 5% diborane, i.e., the diborane constitutes $\frac{1}{2}$% to 5% of the silane-diborane atmosphere, at a pressure of 0.1 to 1 torr is bled into the vacuum chamber 32 while the electrode 28 is brought to a temperature in the range of 200° C. to 500° C. A glow discharge is initiated in the vacuum chamber 32 by energizing the power source 42. The glow discharge is continued for about 1 to 2 seconds with a current density of about 0.3ma/cm$^2$ to 3.0ma/cm$^2$ at the deposition surface of the electrode 28 for deposition of the first doped layer 13.

The atmosphere in the vacuum chamber 32 is then pumped out by a mechanical pump 46. Next, the vacuum chamber 32 is brought to a pressure of about $10^{-6}$ torrs and silane is then bled into the vacuum chamber 32 at a pressure of 0.1 to 5 torrs. Again a glow discharge is initiated for one to 5 minutes with a current density of from 0.3ma/cm$^2$ to 3.0ma/cm$^2$ at the surface of the first doped layer 13 for the deposition of the "intrinsic" layer 17.

Next, about 0.1 to 5.0% phosphine, as a doping gas, is bled into the vacuum chamber 32, so that the phosphine constitutes 0.1 to 5.0% of the silane-phosphine atmosphere. The glow discharge is initiated with a current density of about $0.3ma/cm^2$ to $3.0ma/cm^2$ at the surface of the "intrinsic" layer 17 and the second doped layer 15 is then deposited on the surface of the "intrinsic" layer 17.

While the phosphine and diborane were mentioned as doping gases for the first and second doped layers 13 and 15, it is anticipated that other appropriate doping gases well known in the art can also be used.

The second electrode 27 is then deposited on a surface of the second doped layer 15 by state of the art evaporation techniques. Final fabrication of the electroluminescent semiconductor device 10 includes connecting contacting leads (not shown) to the first and second electrode 28 and 27 for electrical connection to external circuitry.

If the body 14 were fabricated by a glow discharge in a gas atmosphere which includes the elements silicon, hydrogen and a halogen selected from the group consisting of chlorine, bromine and iodine, the gases bled into the vacuum chamber 32 would be hydrogen, $H_2$, and a gas, hereinafter referred to as the deposition gas, containing silicon and a selected halogen such as dichlorosilane ($SiH_2Cl_2$), chlorosilane, ($SiH_3Cl$), trichlorine ($SiHCl_3$), bromosilane, ($SiH_3Br$), diboromosilane, ($SiH_2Br_2$). It has been found that the deposited amorphous silicon possesses good electrical properties if the ratio of hydrogen to deposition gas is in the range of 1:1 to 4.5:1.

Figure 3:
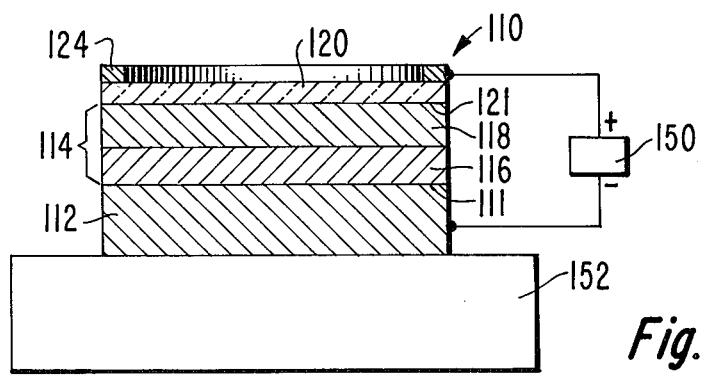
FIG. 3 is a cross-sectional view of a Schottky barrier semiconductor device utilized in the present invention.

Referring to FIG. 3, a second embodiment of an electroluminescent semiconductor device of the present invention is designated as 110. The second embodiment of the electroluminescent semiconductor device 110, is a Schottky barrier semiconductor device. The electroluminescent device 110 includes a substrate 112 of a material having good electrical conductivity properties. Typically, the substrate 112 will be of a material such as aluminum, niobium, tantalum, chromium, iron, bismuth, antimony, stainless steel, highly doped N type single crystal or polycrystalline silicon or indium tin oxide on glass where the indium tin oxide is the conducting material.

On a surface of the substrate 112 is a body 114 of amorphous silicon fabricated by a glow discharge in $SiH_4$. The body 114 includes a first layer 116 of amorphous silicon fabricated by a glow discharge in a mixture of silane and a doping gas capable of having an ohmic contact with the substrate 112 and having a first interface 111 therebetween. The function of the first layer 116 is to assist the body 114 in making ohmic contact to the substrate 112. The first layer 116 may be of a uniform dopant concentration on the order of 5 atomic percent dopant.

A second layer 118 of amorphous silicon of the body 114 is on the first layer 116 opposite the substrate 112. The second layer 118 is fabricated by a glow discharge in silane, $SiH_4$, and typically by a glow discharge in substantially pure silane. Since the glow discharge may be in substantially pure silane it would be anticipated that the second layer 118 is undoped. However, it has been discovered that the second layer 118, even if fabricated in pure silane, is very slightly N doped. The first and second layers are of the same conductivity type.

On a surface of the second layer 118 opposite the substrate 112 is a metallic region 120 with an interface 121 therebetween. The metallic region 120 is typically at least semi-transparent to radiation generated within the body 114. Also the metallic region 120 is of a metallic material with good electrical conductivity and if the second layer 118 is slightly N type, the metallic material is of a high work function, i.e. 4.5 eV or greater, such as gold, platinum, palladium, chromium, iridium, or rhodium. The metallic region 120 may be a single layer of a metal or it may be multi-layered. If the metallic region 120 is multi-layered a first layer could be of platinum on the second layer 118, i.e. the platinum will assure a large Schottky barrier height, and a second layer which is on the first platinum layer could be gold or silver, for good electrical conductivity. If the metallic region 120 is to be semi-transparent, its thickness will be typically about 50A.

On a surface of the metallic layer 120 opposite the interface 121 is an electrode 124. Typically, the electrode 124 is of a metal having good electrical conductivity, and capable of having an ohmic contact with the metallic layer 120. The electrode 124 will only be in contact with a small portion of the surface area of metallic layer 120, since the electrode 124 may mask or shadow part of the radiation generated within the body 114 and prevent it from being emitted from the device 110. The electrode 124 may be on the periphery of the metallic layer 120 as shown in FIG. 3, although other configurations well known to those in the art can also be used. The function of the electrode 124 is for the electrical contacting of the metallic layer 120.

In the field of semiconductor devices it is well known that a surface barrier junction, generally known as a Schottky barrier, is formed as a result of contacting certain metals to certain semiconductor materials, i.e. high work function metals to N type semiconductor material or low work function metals to P type semiconductor materials. In the electroluminescent semiconductor device 110 a Schottky barrier is formed at the interface 121 by contacting the metallic region 120 to the body 114.

To operate the electroluminescent device 110, a forward bias voltage is applied to the device 110 by contacting the electrode 124 to the positive terminal of a voltage source 150 of the type well known by those in the art, and by connecting the substrate 112 to the negative terminal of the voltage source 150, assuming the second layer 118 is slightly N type and the first layer 116 is N type. As a result of forward biasing device 110, hole carriers are injected from the metallic region 120 into the second layer 118. The injected holes recombine in the second layer 118 thereby resulting in the generation of radiation. This radiation can be observed through the metallic layer 120 provided the metallic layer 120 is partly transparent. In the operation of the Schottky barrier device 110, free electrons which recombine with the injected carriers in the second layer 118 are replenished by electrons from the first layer 116, assuming the first layer 116 is of N type conductivity. It has been discovered that the Schottky barrier device 110 generally exhibits the same elctroluminescence characteristics as the PIN device 10. Furthermore, like the first embodiment 10, the second embodiment 110 is preferably operated at a temperature range of 78° K. to 105° K., by contacting the device 110 to temperature cooling means 152.

The apparatus 30 can also be utilized in the fabrication of the Schottky barrier electroluminescent device 110. The apparatus 30 is prepared for deposition of the first layer 116 by placing the substrate 112, e.g. stainless steel, on the heating plate 38 and by connecting the substrate 112 to one terminal of the power source 42 and the electrode 36 to an opposite terminal of the power source 42. The D. C. cathodic mode of operation is assumed. The vacuum chamber 32 is then evacuated to a pressure of about 0.5 to 1.0 $\times$ 10$^{-6}$ torrs and the substrate 112 is heated to a temperature in the range of 150° to 450° C. by energizing the heating coils of the heating plate 38. Next, an atmosphere of about 98.5% silane, SiH$_4$, and about 1.5% N type doping gas is bled into the vacuum chamber 32 to a pressure of 0.1 to 5 torrs and as a result the substrate temperature is raised to a value in the range of 200° C. to 500° C. Typically, the N type doping gases which can be utilized in glow discharge processes are phosphine, PH$_3$, and arsine, AsH$_3$. For deposition of the first layer 116, the current density should be in the range of 0.1 to 3.0 ma/cm$^2$ at the deposition surface of the substrate 112. The glow discharge is then initiated by energizing the power source 42 thereby commencing the deposition of the first layer 116. The deposition rate of amorphous silicon increases with the vapor pressure of the silane and the current density in the pressure range of 0.1 to 5 torrs. Under the conditions described, one micron of amorphous silicon is deposited in less than 5 minutes. After deposition of the first layer 116 the atmosphere in the vacuum chamber is then pumped out by the mechanical pump 46. With the vacuum chamber 32 at a pressure of about 10$^{-6}$ torrs, substantially pure silane is bled into the vacuum chamber 32 at a pressure in the range of 0.1 to 5 torrs. Again a glow discharge in initiated for one to five minutes. A current density of from 0.3ma/cm$^2$ to 3.0ma/cm$^2$ is needed at the surface of the first layer 116 for the deposition of the second layer 118 of amorphous silicon. After deposition of the first and second layers 116 and 118, the wafer is placed in a state of the art evaporation system and the metallic film 120 is deposited on the second layer 118 and by state of the art evaporation techniques the electrode 124 is deposited on the metallic film 120.

Fabrication of the device 110 is completed by connecting of wire electrodes (not shown) to the substrate 112 and the electrode 124 for connection to external circuitry.

Like the body 14 of the first embodiment 10, the body 114 of the second embodiment 110 can also be fabricated by a glow discharge in a gas atmosphere which includes the elements silicon, hydrogen and a halogen selected from the group consisting of chlorine, bromine and iodine.

It should be noted that the first and second embodiments 10 and 110 utilized as electroluminescent devices in the present invention are by way of examples.

It is obvious to those skilled in the art that other semiconductor devices having a body of amorphous silicon fabricated by a glow discharge can be utilized in the present invention.

In the present invention, Schottky barrier and PIN devices having a body of amorphous silicon fabricated by a glow discharge in silane are forward biased for the generation of radiation within the bodies.

We claim:

1. An electroluminescent semiconductor device comprising:
    a body of amorphous silicon fabricated by a glow discharge, said body having a semiconductor junction either at the surface or in said body; and
    means for forward biasing said body with a voltage so as to generate radiation in said body.

2. The electroluminescent device in accordance with claim 1 wherein said body of amorphous silicon is fabricated by a glow discharge in silane, SiH$_4$.

3. The electroluminescent device in accordance with claim 1 wherein said body of amorphous silicon is fabricated by a glow discharge in a gas atmosphere having silicon, hydrogen and a halogen selected from the group consisting of chlorine, bromine and iodine.

4. The electroluminescent semiconductor device in accordance with claim 1 wherein said means for forward biasing is a voltage source.

5. The electroluminescent semiconductor device in accordance with claim 1 further comprising means for cooling said body to a temperature in the range of 78° K. to 105° K.

6. The electroluminescent semiconductor device in accordance with claim 5 wherein said means for cooling is the cold finger of a liquid nitrogen Dewar.

7. The electroluminescent semiconductor device in accordance with claim 5 wherein said means for cooling is thermoelectric.

8. The electroluminescent semiconductor device in accordance with claim 2 wherein said body comprises a first doped layer of one conductivity type spaced from a second doped layer of an opposite conductivity type with an "intrinsic" layer between and in contact with the first and second doped layers.

9. The electroluminescent semiconductor device in accordance with claim 8 further comprising:
    a first electrode of good electrical conductivity on a surface of said first doped layer opposite the "intrinsic" layer; and
    a second electrode on a surface of said second doped layer opposite the "intrinsic" layer.

10. The electroluminescent semiconductor device in accordance with claim 9 wherein said means for forward biasing is a voltage source, with one polarity terminal of said voltage source connected to said first electrode and an opposite polarity terminal of said voltage source is connected to said second electrode.

11. The electroluminescent semiconductor device in accordance with claim 2 further comprising:
    a metallic film on a surface of said body providing a surface barrier junction at the interface of said metallic film and said body.

12. The electroluminescent semiconductor device in accordance with claim 11 wherein said body has a first layer of doped amorphous silicon fabricated by a glow discharge in a mixture of silane and a doping gas, and a second layer of amorphous silicon fabricated by a glow discharge in silane on a surface of said first layer, said metallic layer is on a surface of said second layer opposite said first layer, with said barrier junction at the interface of said metallic film and said second layer.

13. The electroluminescent semiconductor device in accordance with claim 12 wherein said first layer is on a substrate which is electricaly conductive and capable of having an ohmic contact with said first layer, and an electrode is on a portion of a surface of said metallic layer, said electrode is capable of having an ohmic contact with said metallic layer.

14. The electroluminescent semiconductor device in accordance with claim 13 wherein said means for forward biasing is a voltage source with one polarity terminal of said voltage source being connected to said substrate and an opposite polarity terminal of said voltage source being connected to said electrode.

* * * * *